(12) United States Patent
Miyata et al.

(10) Patent No.: US 10,971,891 B2
(45) Date of Patent: Apr. 6, 2021

(54) LIGHT SOURCE DEVICE

(71) Applicant: Nichia Corporation, Anan (JP)

(72) Inventors: Tadaaki Miyata, Yokohama (JP); Hideaki Takeda, Kawasaki (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/525,075

(22) Filed: Jul. 29, 2019

(65) Prior Publication Data
US 2020/0036158 A1  Jan. 30, 2020

(30) Foreign Application Priority Data

Jul. 30, 2018  (JP) .............................. JP2018-142221

(51) Int. Cl.
*H01S 5/068* (2006.01)
*H01S 5/022* (2021.01)
(Continued)

(52) U.S. Cl.
CPC ...... *H01S 5/02248* (2013.01); *H01S 5/02276* (2013.01); *H01S 5/02292* (2013.01); *H01S 5/0425* (2013.01); *H01S 5/06825* (2013.01); *H01S 5/3013* (2013.01); *H01S 5/4093* (2013.01); *H01S 5/02216* (2013.01)

(58) Field of Classification Search
CPC ............ H01S 5/02216; H01S 5/02276; H01S 5/02248; H01S 5/06825; H01L 33/62
See application file for complete search history.

(56) References Cited

U.S. PATENT DOCUMENTS

2002/0149314 A1  10/2002  Takahashi et al.

FOREIGN PATENT DOCUMENTS

JP  2002-314146 A  10/2002
JP  2006-173392 A  6/2006
(Continued)

*Primary Examiner* — Michael Carter
(74) *Attorney, Agent, or Firm* — Birch, Stewart, Kolasch & Birch, LLP

(57) ABSTRACT

A light source device includes at least one first wiring, a plurality of second wirings, a plurality of light emitting elements each having a lower-surface-side electrode connected to a respective one of the at least one first wiring, a plurality of protective elements each having a lower-surface-side electrode connected to a respective one of the plurality of second wirings each corresponding to a respective one of the plurality of light emitting elements, each of the plurality of protective elements connected to a respective one of the plurality of light emitting elements, a plurality of first wirings each connecting an upper-surface-side electrode of each of the plurality of light emitting elements and a respective one of the plurality of second wirings, a plurality of second wires each connecting the upper-surface-side electrodes of two adjacent ones of the protective elements; and a plurality of third wires each connecting an upper-surface-side electrode of a respective one of the plurality of protective elements and a corresponding one of the at least one first wiring. The upper-surface-side electrodes of the plurality of light emitting elements and the upper-surface-side electrodes of the plurality of protective elements are of a same polarity, and the plurality of first wires are disposed below the plurality of second wires.

12 Claims, 5 Drawing Sheets

(51) Int. Cl.
    *H01S 5/042*     (2006.01)
    *H01S 5/30*     (2006.01)
    *H01S 5/40*     (2006.01)
    *H01S 5/02216*     (2021.01)

(56) References Cited

FOREIGN PATENT DOCUMENTS

| WO | WO 2011/030252 A1 | 3/2011 |
| WO | WO 2016/152562 A1 | 9/2016 |
| WO | WO2016152562 * | 9/2016 |

* cited by examiner

LIGHT SOURCE DEVICE

CROSS-REFERENCE TO RELATED PATENT APPLICATION

The present application claims priority under 35 U. S. C. § 119 to Japanese Patent Application No. 2018-142221, filed Jul. 30, 2018. The contents of Japanese Patent Application No 2018-142221 are incorporated herein by reference in its entirety.

BACKGROUND OF THE INVENTION

1. Field of the Invention

The present invention relates to a light source device that includes a plurality of light emitting elements.

2. Description of Related Art

In order to obtain light of a desired color from a light source device, a plurality of light emitting elements configured to emit light of different wavelength ranges can be discretely controlled. In that case, a separate wiring is required for at least one of the positive electrodes and a negative electrode of each of the light emitting elements, and further, a protective element is required for each of the light emitting elements.

One example of such a light source device includes a plurality of light emitting elements mounted on a common wiring, a protective element is mounted on each of the wirings corresponding to each of the light emitting elements, and an upper-surface-side electrode of each of the light emitting elements and an upper-surface-side electrode of each of the protective elements have the same polarity. In such a structure, components are needed to be spaced apart from one other to avoid short circuit between the wirings connected to the upper-surface-side electrodes of the light emitting elements and the wirings connected to the upper-surface-side electrodes of the protective elements. Accordingly, the substrate used in such a light source device needs to have a large area as a whole.

To accommodate this, a light source device has been proposed in which the protective elements and the light emitting elements are mounted with different polarities (for example, see Japanese Unexamined Patent Application Publication No. 2002-314146).

SUMMARY OF THE INVENTION

In the light source device described in Japanese Unexamined Patent Application Publication No. 2002-314146, the polarity of the upper-surface-side electrodes of the protective elements and the polarity of the upper-surface-side electrodes of the light emitting elements are different to each other, to allow mounting of the protective elements and the light emitting elements on the same wiring. With this, more efficient arrangement and wiring can be realized in terms of avoiding short circuit between the wires connected to the light emitting elements and the wires connected to the protective elements. However, an increase in the number of the light emitting elements mounted in the light source device increases the area of the wiring for mounting the light emitting elements and the protective elements, which requires insulating margins between the wirings. As a result, a large area is required for the substrate. This limits a reduction in the size of the light source device.

The present disclosure is devised to address such requirements, and it is hence an object thereof to provide a light source device of a small size in which the plurality of light emitting elements can be discretely controlled.

Accordingly, a light source device according to one embodiment of the present invention includes: at least one first wiring; a plurality of second wirings each corresponding to a respective one of the plurality of light emitting elements; a plurality of light emitting elements each having a top electrode and a bottom electrode, the bottom electrode connected to the at least one first wiring; a plurality of protective elements each having a top electrode and a bottom electrode, the bottom electrode connected to a respective one of the plurality of second wirings, and each connected to a respective one of the plurality of light emitting elements; a plurality of first wires each connecting the top electrode of each of the plurality of light emitting elements and a corresponding one of the plurality of second wirings; a plurality of second wires each connecting top electrodes of the plurality of protective elements; and at least one third wire connecting the top electrode of at least one protective element and the at least one first wiring. The top electrodes of the plurality of light emitting elements and the top electrodes of the plurality of protective elements have the same polarity, and the plurality of first wires are disposed at locations lower than the second wires.

As described above, the present disclosure can provide a light source device of a small size in which a plurality of light emitting elements can be discretely controlled.

DETAILED DESCRIPTION OF THE EMBODIMENTS

Figure 1:
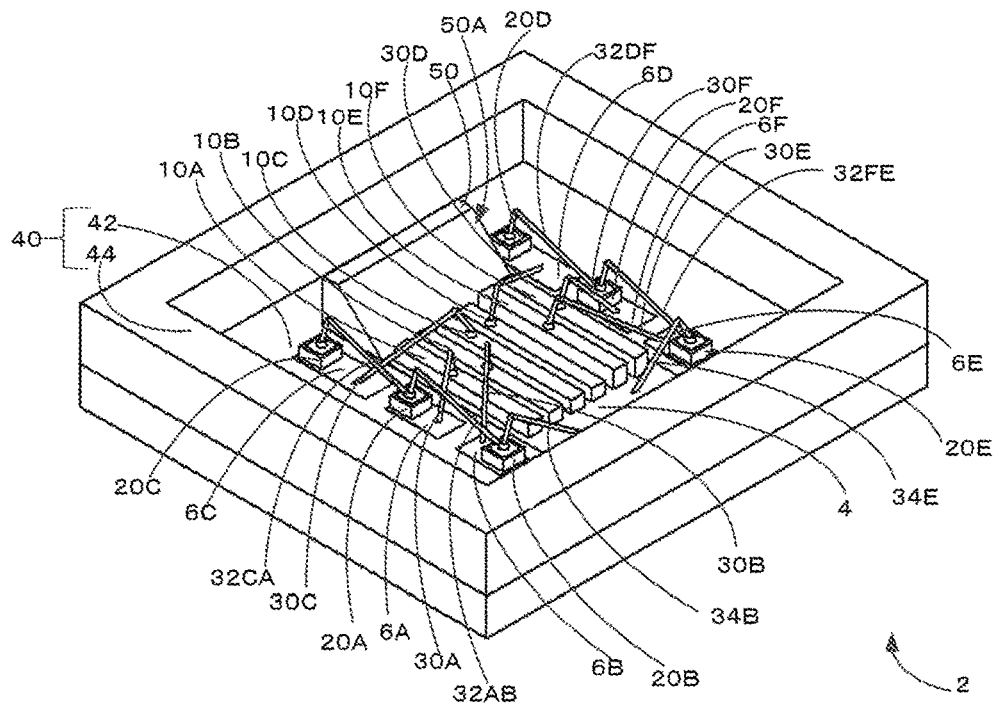
FIG. 1 is a perspective view schematically showing a light source device according a first embodiment of the present invention.

Embodiments of the present invention will be described below with reference to the accompanying drawings. It is to be FIG that the light source device described below is intended for implementing the technical concept of the present invention, and the present invention is not limited to those described below unless otherwise specified.

In the drawings, the same or similar portions or members may be assigned the same reference numerals. For the sake of easy understanding, different embodiments and examples may be illustrated, but partial replacement and/or combination of components illustrated in the embodiments and examples can be appropriately performed. Repetitive descriptions may be omitted in the embodiments and examples and differences may be illustrated. Similar effects obtained through similar structure may not be repeated in each of the embodiments and examples. In the drawings, the size, positional relationship and the like of the members may be exaggerated for clarity.

Light Source Device According to First Embodiment

Figure 2:
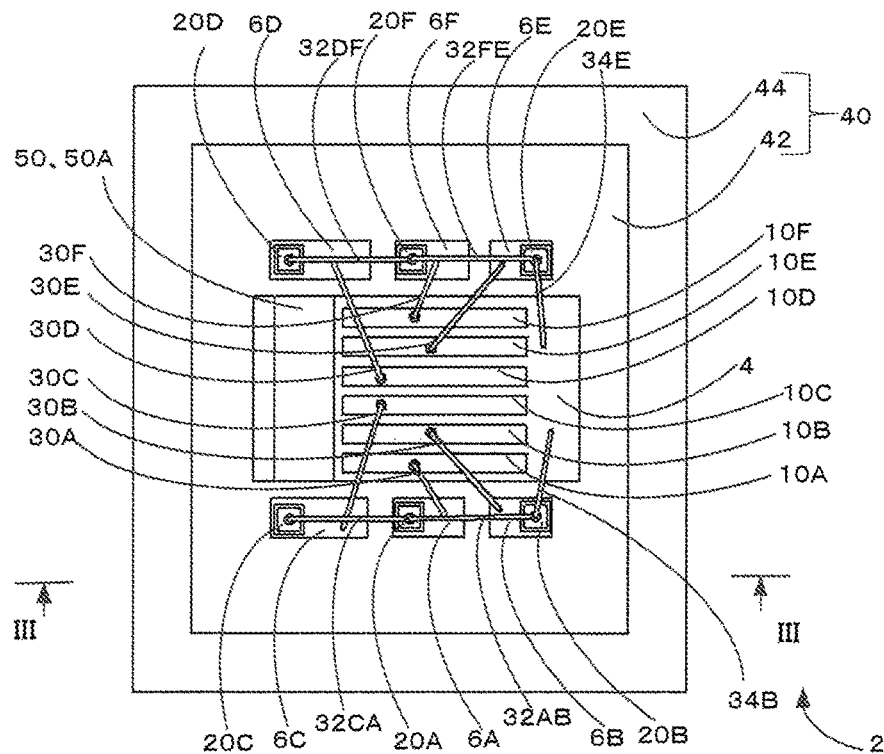
FIG. 2 is a plan view schematically showing a light source device according the first embodiment of the present invention.
Figure 3:
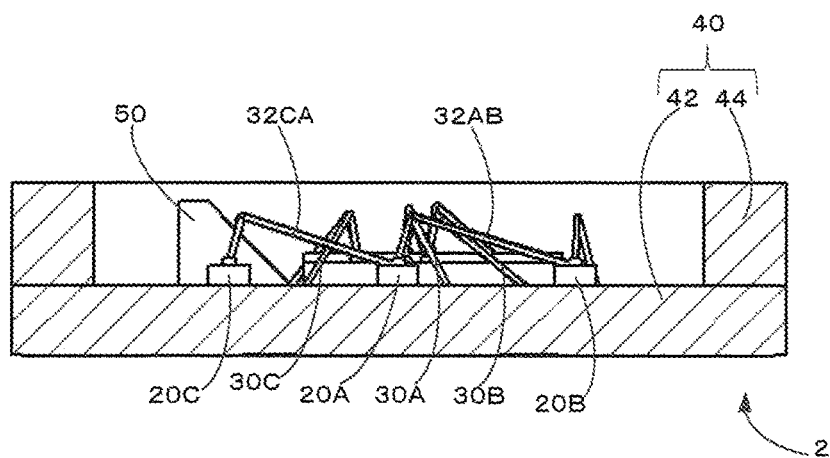
FIG. 3 is a cross-sectional view taken along line in FIG. 2.
Figure 4:
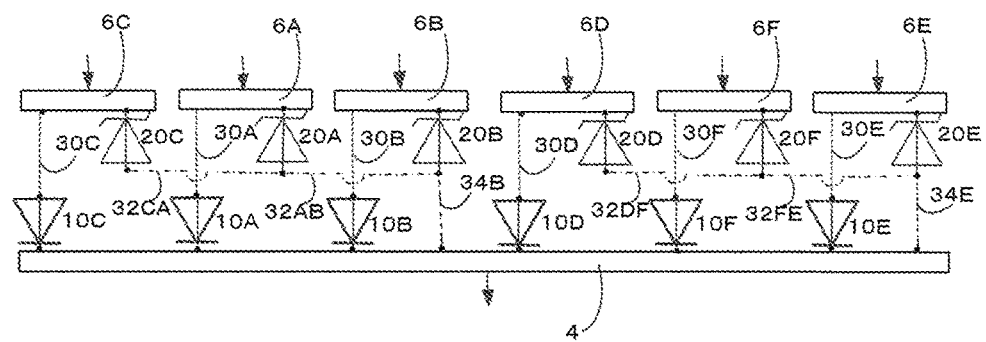
FIG. 4 is a circuit diagram showing a circuit configuration of a light source device according the first embodiment of the present invention.

A light source device according to a first embodiment of the present invention will be described with reference to FIG. 1 to FIG. 4. FIG. 1 is a perspective view schematically showing a light source device according the first embodiment of the present invention. FIG. 2 is a plan view schematically showing a light source device according the first embodiment of the present invention, shown in FIG. 1. FIG. 3 is a cross-sectional view taken along line in FIG. 2. FIG. 4 is a circuit diagram showing a circuit configuration of a light source device according the first embodiment of the present invention. In the circuit diagram shown in FIG. 4, a direction of the flow of electric current is indicated by arrows.

The light source device 2 according to the first embodiment includes a package 40 having a substrate 42 and a sidewall 44 formed along a periphery of the substrate 42. In the first embodiment, the substrate 42 has a plate-like shape. The substrate 42 and the sidewall 44 can be formed integrally or a discrete substrate 42 and a discrete side wall 44 can be bonded to each other.

A plurality (six in the first embodiment) of light emitting elements 10A to 10F are disposed on the substrate 42. An upward-reflecting mirror 50 having a light-reflecting surface 50A configured to reflect light emitted from the light emitting elements 10A to 10F is disposed on the substrate 42. Light emitted from the light emitting elements 10A to 10F are reflected at the light-reflecting surface 50A in an upward direction substantially normal to the substrate 42.

For the material of the substrate 42, the lateral walls 44, and the upward-reflecting mirror 50, a known material such as glass, a single crystal or a polycrystal of silicon etc., a ceramic material, or a resin material can be used. Alternative to the upward-reflecting mirror 50, the lateral wall 44 can be used as a light-reflecting surface to reflect light emitted from the light emitting elements 10A to 10F in an upward direction substantially normal to the upper surface of the substrate 42.

The light source device 2 according to the first embodiment includes one or a plurality of (one in FIG. 1 to FIG. 4) first wiring 4, and a plurality of (six in FIG. 1 to FIG. 4) second wirings 6A to 6 on the substrate 42. A plurality of (six in FIG. 1 to FIG. 4) light emitting elements 10A to 10F are mounted on the first wiring 4. Each of the light emitting elements 10A to 10F has a P-electrode (positive electrode) as an upper-surface-side electrode, an N-electrode (negative electrode) as a lower-surface-side electrode, and the lower-surface-side electrode is connected to the first wiring 4.

Further, the protective elements 20A to 20F each corresponding to respective one of the light emitting elements 10A to 10F are mounted on corresponding one of the second wirings 6A to 6F. Each of the protective elements 20A to 20F also has a P-electrode (positive electrode) as an upper-surface-side electrode, an N-electrode (negative electrode) as a lower-surface-side electrode, and the lower-surface-side electrode is connected to corresponding one of the second wirings 6A to 6F.

As described above, the upper-surface-side electrodes of the plurality of light emitting elements 10A to 10F and the plurality of protective elements 20A to 20F have the same polarity. In the first embodiment, the upper-surface-side electrodes are P-electrodes (positive electrodes), but the upper-surface-side electrodes of the plurality of light emitting elements 10A to 10F and the plurality of protective elements 20A to 20F may be N-electrodes (negative electrodes).

In the first embodiment, laser diodes are used as the light emitting elements 10A to 10F. For the laser diodes, nitride semiconductor laser elements to emit light in an ultraviolet to green light range, GaAs-based semiconductor laser elements to emit light in a red to infrared range can be used. With this arrangement, a light source device 2 having high luminance and high color reproductivity can be obtained.

For the light emitting elements, other than the laser diodes, any other appropriate light emitting elements such as light emitting diodes can also be used.

The protective elements 20A to 20F are for protecting the light emitting elements 10A to 10F from a surge current or static electricity, and Zener diodes are used in the first embodiment. As the protective elements, any other appropriate protective elements such as varistor elements, ESD suppressors, or arrestor elements can also be used.

The upper-surface-side electrodes of the light emitting elements 10A to 10F and corresponding second wirings 6A and 6F are respectively connected with corresponding first wires 30A to 30F. As will be described below, supplying electric power through the second wirings 6A to 6F, the light emitting elements 10A to 10F can be discretely caused to emit light.

The plurality of protective elements 20A to 20F are respectively corrected with the second wires 32CA, 32AB, 32DF, and 32FE. Further, the upper-surface-side electrode of at least one protective element (20B and 20E in the first embodiment) and the first wiring 4 are respectively connected with the third wires 34B and 34E. As will be described below, with this arrangement, even if a surge, static electricity, or a reverse current flows in the second wirings 6A to 6F, they can be prevented from flowing in the light emitting elements 10A to 10F.

As shown in FIG. 1 and FIG. 2, in the first embodiment, three light emitting elements 10A to 10C and respectively corresponding protective elements 20A to 20C, and three light emitting elements 10D to 10F and respectively corresponding protective elements 20D to 20F are arranged substantially symmetrical and the wires are connected.

Light Emitting Elements 10A to 10C

In the description below, the three light emitting elements 10A to 10C and respectively corresponding protective elements 20A to 20C that are arranged in a lower side in FIG. 2 will be illustrated as the substantially symmetrically arranged components and corresponding wiring.

As for the light emitting element 10A, the upper-surface-side electrode of the light emitting element 10A and the second wiring 6A are connected with the first wire 30A. The lower-surface-side electrode of the light emitting element 10A is connected to the first wiring 4. When electric power is applied to the second wiring 6A, electric current flows through the first wire 30A to the upper-surface-side electrode (P-electrode) of the light emitting element 10A, which then flows to the p-type cladding layer, the active layer, and the n-type cladding layer in this order, then from the lower-surface-side electrode (N-electrode) of the light emitting element 10A flows to the first wiring 4. Accordingly, the light emitting element 10A can be discretely caused to emit light.

Similarly, as for the light emitting element 10B, the upper-surface-side electrode of the light emitting element 10B and the second wiring 6B are connected with the first wire 30B. The lower-surface-side electrode of the light emitting element 10B is connected to the first wiring 4. When electric power is applied to the second wiring 6B, electric current flows through the first wire 30B to the upper-surface-side electrode (P-electrode) of the light emitting element 10B, which then flows to the p-type cladding layer, the active layer, and the n-type cladding layer in this order, then from the lower-surface-side electrode (N-electrode) of the light emitting element 10B flows to the first wiring 4. Accordingly, the light emitting element 10B can be discretely caused to emit light.

Similarly, as for the light emitting element 10C, the upper-surface-side electrode of the light emitting element 10C and the second wiring 6C are connected with the first wire 30C. The lower-surface-side electrode of the light emitting element 10C is connected to the first wiring 4. When electric power is applied to the second wiring 6C, electric current flows through the first wire 30C to the upper-surface-side electrode (P-electrode) of the light emitting element 10C, which then flows to the p-type cladding layer, the active layer, and the n-type cladding layer in this order, then from the lower-surface-side electrode (N-electrode) of the light emitting element 10C flows to the first wiring 4. Accordingly, the light emitting element 10C can be discretely caused to emit light.

Next, the protective elements 20A to 20C will be described. The protective element 20A corresponding to the light emitting element 10A is mounted on the second wiring 6A corresponding to the light emitting element 10A, such that the lower-surface-side electrode (N-electrode) of the protective element 20A is in contact with the second wiring 6A. The protective element 20B corresponding to the light emitting element 10B is mounted on the second wiring 6B corresponding to the light emitting element 10B, such that the lower-surface-side electrode (N-electrode) of the protective element 20B is in contact with the second wiring 6B. The protective element 20C corresponding to the light emitting element 10C is mounted on are disposed second wiring 6C corresponding to the light emitting element 10C, such that the lower-surface-side electrode (N-electrode) of the protective element 20C is in contact with the second wiring 6C.

As shown in FIG. 1 and FIG. 2, in the first embodiment, from the left side in the figures (the upward-reflecting mirror 50-side), the second wiring 6C corresponding to the light emitting element 10C, the second wiring 6A corresponding to the light emitting element 10A, and the second wiring 6B corresponding to the light emitting element 10B are arranged in this order.

The upper-surface-side electrode (P-electrode) of the protective element 20C located at the leftmost side and the upper-surface-side electrode (P-electrode) of the protective element 20A located at the center are connected with the second wire 32CA. The upper-surface-side electrode (P-electrode) of the protective element 20A located at the center and the upper-surface-side electrode (P-electrode) of the protective element 20B located at the rightmost side are connected with the second wire 32AB. The upper-surface-side electrode (P-electrode) of the protective element 20B located at the rightmost side and the first wiring 4 are connected with the third wire 34B.

With this arrangement, if an overvoltage caused by static electricity or a reverse current occurs on the second wiring 6C, electric current flows from the second wiring 6C to the lower-surface-side electrode (N-electrode) of the protective element 20C, and through the protective element 20C, flows to the upper-surface-side electrode (P-electrode) of the protective element 20C. The electric current flows from the upper-surface-side electrode (P-electrode) of the protective element 20C through the second wire 32CA to the upper-surface-side electrode (P-electrode) of the protective element 20A, then from the upper-surface-side electrode (P-electrode) of the protective element 20A, through the second wire 32AB to the upper-surface-side electrode (P-electrode) of the protective element 20B. Further, the electric current flows from the upper-surface-side electrode (P-electrode) of the protective element 20B through the third wire 34B to the first wiring 4.

Electric current flows through the path of least resistance, such that the electric current which flows from the second wire 32CA to the protective element 20A will not flow into the protective element 20A but will flow to the second wire 32AB. Further, the electric current which flows from the second wire 32AB to the protective element 20B will not flow into the protective element 20B but will flow to the third wire 34B. With this arrangement, the light emitting elements 10C can be reliably protected against reverse current.

With this arrangement, if a surge current or static electricity occurs on the second wiring 6A, electric current flows from the second wiring 6A to the lower-surface-side electrode (N-electrode) of the protective element 20A, and through the protective element 20A, flows to the upper-surface-side electrode (P-electrode) of the protective element 20A. The electric current flows from the upper-surface-side electrode (P-electrode) of the protective element 20A through the second wires 32AB and 32CA to the upper-surface-side electrode (P-electrode) of the protective element 20B, then from the upper-surface-side electrode (P-electrode) of the protective element 20B, through the third wire 34B to the first wiring 4.

Electric current flows through the path of least resistance, such that the electric current which flows from the second wire 32AB to the protective element 20B will not flow into the protective element 20B but will flow to the third wire 34B. Accordingly, the light emitting element 10A can be reliably protected against reverse current.

With this arrangement, if a surge current or static electricity occurs on the second wiring 6B, electric current flows from the second wiring 6B to the lower-surface-side electrode (N-electrode) of the protective element 20B, and through the protective element 20B, flows to the upper-surface-side electrode (P-electrode) of the protective element 20B. Further, the electric current flows from the upper-surface-side electrode (P-electrode) of the protective element 20B through the third wire 34B to the first wiring 4. Accordingly, the light emitting element 10B can be reliably protected against reverse current.

Wirings of Light Emitting Elements and Protective Elements

Next is described is a wiring structure of the light source device that includes a plurality of light emitting elements mounted on one or a plurality of wirings, a protective element corresponding to respective one of the light emitting elements mounted on a wiring corresponding to respective one of the light emitting elements, and the upper-surface-side electrodes of the light emitting elements and the upper-surface-side electrodes of the protective elements having the same polarity. Generally, in such a light source device, in order to avoid short circuit of the wires connecting the upper-surface-side electrodes of each of the light emitting elements and their respective corresponding wirings, and the wires connecting the upper-surface-side electrodes of each of the protective elements and one or a plurality of wirings, the components need to be spaced apart from one another. This configuration requires a large area such as the entire substrate.

On the other hand, in the first embodiment, the upper-surface-side electrodes of the plurality of protective elements 20A to 20C are connected with the second wires 32A and 32AB, and the upper-surface-side electrodes of the light emitting elements 10A to 10C and the second wirings 6A to 6C are respectively connected with the first wires 30A to 30C, such that the first wires 30A to 30C are arranged below the second wires 32CA and 32AB.

More specifically, the first wire 30C connecting the upper-surface-side electrode of the light emitting element 10C and the second wiring 6C crosses under the second wire 32CA connecting the upper-surface-side electrode of the protective element 20C and upper-surface-side electrode of the protective element 20A. Moreover, the first wire 30A connecting the upper-surface-side electrode of the light emitting element 10A and the second wiring 6A and the first wire 30B connecting the upper-surface-side electrode of the light emitting element 10B and the second wiring 6B cross under the second wire 32AB connecting the upper-surface-side electrode of the protective element 20A and upper-surface-side electrode of the protective element 20B.

Further, of the protective elements 20A to 20C connected with each other at their upper-surface-side electrodes, the upper-surface-side electrode of the protective element 20B located at a position with a lower possibility of short circuiting with other components and the first wiring 4 are connected with the third wire 34B. With this arrangement, even if a surge current or static electricity occurs on any of the second wirings 6A to 6C, a reverse current can be diverted with the second wires 32CA and 32AB connecting the upper-surface-side electrodes of the protective elements 20A to 20C and the third wire 34B connecting the upper-surface-side electrode of the protective element 20B and the first wiring 4, such that the reverse current can be bypassed to the first wiring 4 without flowing to the light emitting elements 10A to 10C.

As described above, according to the first embodiment, in the light source device 2 configured to discretely control a plurality of light emitting elements 10A to 10C, short circuit of wires can be efficiently prevented by spatially arranging the wires using the height of the protective elements 20A to 20C, even when the light emitting elements 10A to 10C mounted on the first wiring 4 and the protective elements 20A to 20C mounted on the second wirings 6A to 6C are closely arranged.

In particular, even when the first wiring 4 and the second wirings 6A to 6C are disposed on substantially a same plane, short circuit of wires can be reliably avoided due to the spatial arrangement of the wires using the height of the protective elements 20A to 20C.

If the protective elements 20A to 20C are not disposed at a lateral side with respect to the light emitting elements 10A to 10C, connecting the upper-surface-side electrodes of the protective elements 20A to 20C and the first wiring 4 with the wires becomes difficult. In particular, as in the first embodiment, when the upward-reflecting mirror 50 is disposed facing the light-emitting side of the lights 10A to 10F, a necessity may arise for disposing some of the protective elements such as the protective element 20C at a lateral side with respect to the upward-reflecting mirror 50. That is, the upward-reflecting mirror 50 is disposed facing the light-emitting side of the light emitting elements 10A to 10F, and at least one of the protective elements 20A to 20C (e.g., the protective element 20C) is disposed at a lateral side with respect to the upward-reflecting mirror 50. In this case, the upper-surface-side electrode of the protective element 20C that is disposed at a lateral side with respect to the upward-reflecting mirror 50 and the first wiring 4 may become difficult to connect through a wire.

However, the upper-surface-side electrodes of the protective elements 20A to 20C are connected with the second wires 32CA and 32AB, and the upper-surface-side electrode of the protective element 20B located at a position with low possibility of short circuit with the upward-reflecting mirror 50 and the light emitting elements 10A to 10C is connected to the first wiring 4 with the third wire 34, such that even when a reverse current occurs on the second wiring 6C, the reverse current flows through the protective element 20C to the first wiring 4, without flowing in the light emitting element 10C.

In the first embodiment, the second wiring 6C corresponds to the light emitting element 10C located at an inward portion along a width direction of the substrate 42 is arranged at the leftmost side (i.e., the upward-reflecting mirror 50-side) in the figure, but other appropriate arrangement can also be employed. Depending on the locations of the upper-surface-side electrodes of the light emitting elements and arrangement of other components, the second wiring 6A (or 6B) at an outer side and corresponding to the light emitting element 10A (or 10B) in FIG. 1 and FIG. 2 may be disposed leftmost (a lateral side with respect to the upward-reflecting mirror 50) in the figures. Accordingly, various spatial arrangements of the first wires and the second wires can be employed.

In the first embodiment, the upper-surface-side electrode of the protective element 20B located rightmost in FIG. 2 and the first wiring 4 are connected with the third wire 34B, but any other appropriate arrangement can be employed. According to the arrangement of the components, the upper-surface-side electrode of any protective element 20 and the first wiring 4 can be connected with the third wire 34. If the arrangement of the components allows the use of wires, the upper-surface-side electrodes of the plurality of protective elements 20 and the first wiring 4 can be connected with a plurality of third wires 34.

Also, in the first embodiment, a plurality of light emitting elements 10A to 10F are mounted on a single first wiring 4, but each of the light emitting elements 10 may be mounted on a corresponding one of a plurality of first wirings. In such a case, connecting the upper-surface-side electrode of at least one protective element 20 and either one of the first wirings with the third wire 34 can release electric current that has flowed through any protective element 20 to the first wiring connected to the third wire 34 via the second wires 32 connecting the upper-surface-side electrodes of the protective elements 20 and the third wire 34.

Light Emitting Elements 10D to 10F

Next, referring to FIG. 1 and FIG. 2, the light emitting elements 10D to 10F and respectively corresponding protective elements 20D to 20F, which are arranged symmetric with respect to the light emitting elements 10A to 10C and respectively corresponding protective elements 20A to 20C will be described. The arrangement of the light emitting elements 10D to 10F and respectively corresponding protective elements 20D to 20F and corresponding wirings and function are similar to those described above.

More specifically, the light emitting element 10D, the protective element 20D, the second wiring 6D, and the first wire 30D respectively corresponds to the light emitting element 10C, the protective element 20C, the second wiring 6C, and the first wire 30C. Similarly, the light emitting element 10F, the protective element 20F, the second wiring 6F, and the first wire 30F respectively corresponds to the light emitting element 10A, the protective element 20A, the second wiring 6A, and the first wire 30A. Similarly, the light emitting element 10E, the protective element 20E, the second wiring 6E, and the first wire 30E respectively corresponds to the light emitting element 10B, the protective element 20B, the second wiring 6B, and the first wire 30B, described above.

Further, the second wire 32DF corresponds to the second wire 32CA described above, the second wire 32FE corresponds to the second wire 32AB described above, and the third wire 34E corresponds to the third wire 34B described above. Those wires have a similar function and configuration as described above and accordingly, repetitive description will be omitted.

Emission Wavelength of Light Emitting Element

The light source device 2 according to the first embodiment includes, for example, the light emitting elements 10A and 10B to emit light in a blue wavelength range, the light emitting elements 10C and 10D to emit light in a green wavelength range, and the light emitting elements 10E and 10F to emit light in a red wavelength range. In this case, a light source device of a small size configured to emit a white light can be realized by condensing the light reflected at the upward-reflecting mirror 50 in an upward direction substantially normal to the upper surface of the substrate 42.

The protective elements 20A and 20B respectively corresponding to the light emitting elements 10A and 10B to emit light of a blue wavelength range are connected with the second wire 32AB. The protective elements 20F and 20E respectively corresponding to the light emitting elements 10F and 10E to emit light of a red wavelength range are connected with the second wire 32FE. In both cases, the upper-surface-side electrodes of the protective elements 20 corresponding to the light emitting elements 10 of the same emission wavelength range are connected with the second wires 32.

Either when the light emitting elements 10 having the same emission wavelength range are discretely controlled or when the light emitting elements 10 having the same emission wavelength range are electrically connected with the second wires 6 and collectively controlled, if an electric current caused by a serge voltage or the like flows from the lower-surface-side electrodes of one or more protective elements 20 to the upper-surface-side electrodes thereof, the electric current will flow through the second wire(s) 32 and the third wire(s) 34 having smaller electric resistance to the first wiring(s) 4, such that the light emitting elements 10 can be reliably protected.

The protective element 20C corresponding to the light emitting element 10C to emit light of a green wavelength range and the protective element 20A corresponding to the light emitting elements 10A to emit light of a blue wavelength range are connected with the second wire 32CA. The protective element 20D corresponding to the light emitting element 10D to emit light of a green wavelength range and the protective element 20F corresponding to the light emitting elements 10F to emit light of a red wavelength range are connected with the second wire 32DF. In both cases, the upper-surface-side electrodes of the protective elements 20 corresponding to the light emitting elements 10 of the different emission wavelength ranges are connected with the second wires 32.

If an electric current caused by a serge voltage or the like flows from the lower-surface-side electrodes of one or more protective elements 20 to the upper-surface-side electrodes thereof, the electric current will flow through the second wire(s) 32 and the third wire(s) 34 having smaller electric resistance to the first wiring(s) 4, such that even when the upper-surface-side electrodes of the protective elements 20 respectively corresponding to the light emitting elements 10 having different emission wavelength ranges are connected, the light emitting elements 10 can be reliably protected.

In particular, the light emitting element 10D to emit light in a green wavelength range is a nitride semiconductor laser and the light emitting element 10F to emit light in a red wavelength range is a GaAs-based semiconductor laser element. That is, the second wire 32DF connecting the protective element 20D corresponding to the light emitting element 10D to emit light in a green wavelength range and the protective element 20F corresponding to the light emitting element 10F to emit light in a red wavelength range is indirectly connecting light emitting element 10D and the light emitting element 10F with different semiconductor materials.

Even in this case, if an electric current caused by a serge voltage or the like flows from the lower-surface-side electrodes of one or more protective elements 20 to the upper-surface-side electrodes thereof, the electric current will flow through the second wire(s) 32 and the third wire(s) 34 having smaller electric resistance to the first wiring(s) 4, such that even when the upper-surface-side electrodes of the protective elements 20 respectively corresponding to the light emitting elements 10 with different semiconductor materials are connected, the light emitting elements 10 can be reliably protected.

Further, a single light emitting element 10 may have a plurality of light emitting points. In this case, the light source device 2 of a small size that can emit light of more various emission wavelength ranges can be realized. In this case, a single light emitting element 10 preferably has a plurality of electrodes. Accordingly, more efficient wiring can be realized and thus the light source device 2 of a small size that nevertheless emits light of more various emission wavelength ranges can be realized.

Light Source Device According to Second Embodiment

Figure 5:
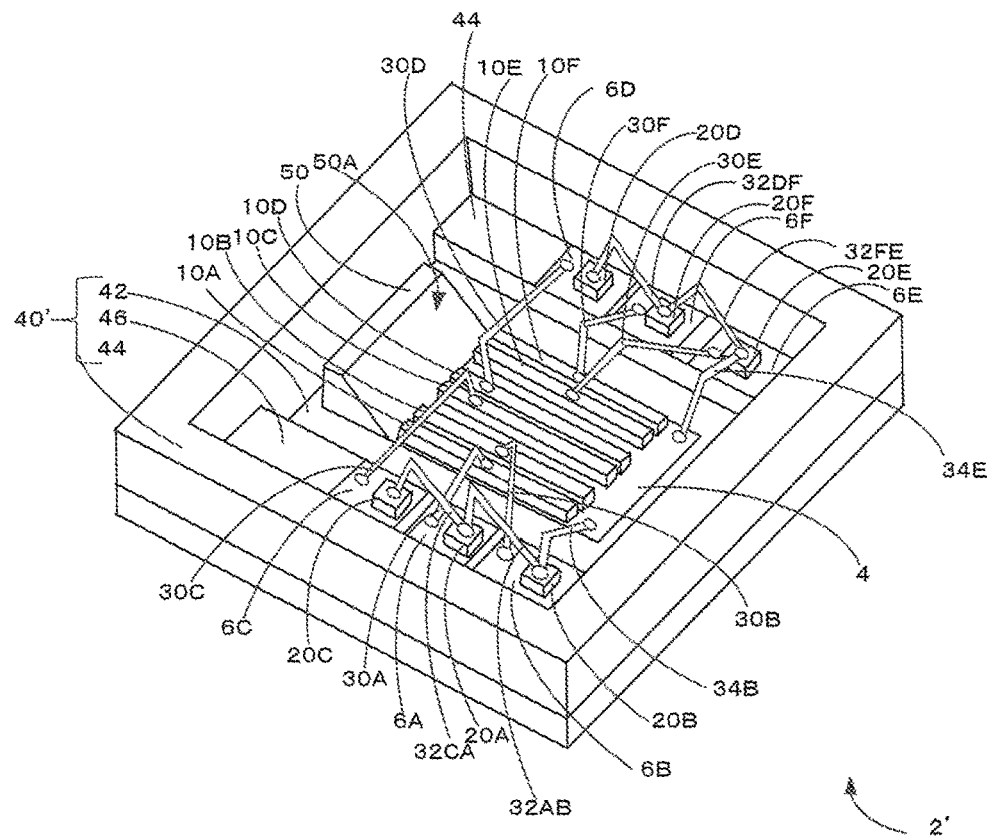
FIG. 5 is a perspective view schematically showing a light source device according a second embodiment of the present invention.

Next, with reference to FIG. 5, the light source device according to a second embodiment of the present invention will be described. FIG. 5 is a perspective view schematically showing a light source device according a second embodiment of the present invention.

The light source device 2' shown in FIG. 5 differs from the light source device 2 according to the first embodiment described above, in which a step portion 46 having an upper surface located higher than the upper surface of the substrate 42 is provided at both lateral sides in the width direction in the package 40'.

The first wiring 4 is disposed on the upper surface of the substrate 42 and a plurality of light emitting elements 10A to 10F are mounted on the first wiring 4. The second wirings 6A to 6F are disposed on the upper surfaces of the step portions 46 that are located higher than the upper surface of the substrate 42, and the protective elements 20A to 20F are respectively mounted on a corresponding one of the second wirings 6A to 6F.

As shown in FIG. 5, in the second embodiment, three light emitting elements 10A to 10C and respectively corresponding protective elements 20A to 20C, and three light emitting elements 10D to 10F and respectively corresponding protective elements 20D to 20F are arranged substantially symmetrical and the wires are connected. The protective elements 20A to 20B respectively corresponding to the light emitting elements 10A to 10D are disposed on the upper surface of one of the two step portions 46 and the protective elements 20D to 20D respectively corresponding to the light emitting elements 10D to 10F are disposed on the upper surface of the other one of the two step portions 46.

In the second embodiment, the plurality of first wires 30C and 30D are not disposed below the corresponding one of the plurality of second wires. Although illustrated as above, other appropriate configurations can also be employed. For example, the second wirings 6C and 6D and the protective elements 20C and 20D can be arranged at a lateral side with respect to the upward-reflecting mirror 50, and similar to the light source device 2 according to the first embodiment, the first wires 30C and 30D are arranged crossing under the second wires 32CA and 32DF.

In the second embodiment, due to the step portions 46, the locations of the second wirings 6A to 6F are higher than the first wiring 4, which facilitates arranging the first wires 30A, 30B, 30E, and 30F passing under the second wires 32CA, 32AB, 32DF, and 32FE.

Moreover, the first wires 30A to 30F pulled up from the upper-surface-side electrodes of the light emitting elements 10A to 10F are not needed to be largely pulled downward to connect to the second wirings 6A to 6F, which can reduce the degree of curving of the wires and thus wiring of high reliability can be realized. Similarly, this configuration can eliminate the need of largely pulling up of the second wires 32CA, 32AB, 32DF, and 32FE from the upper-surface-side electrodes of the protective elements 20A to 20F to avoid short circuit with the first wire, such that the degree of curving of the second wires can also be reduced, thus wiring of high reliability can be realized.

Light Source Device According to Third Embodiment

Figure 6:
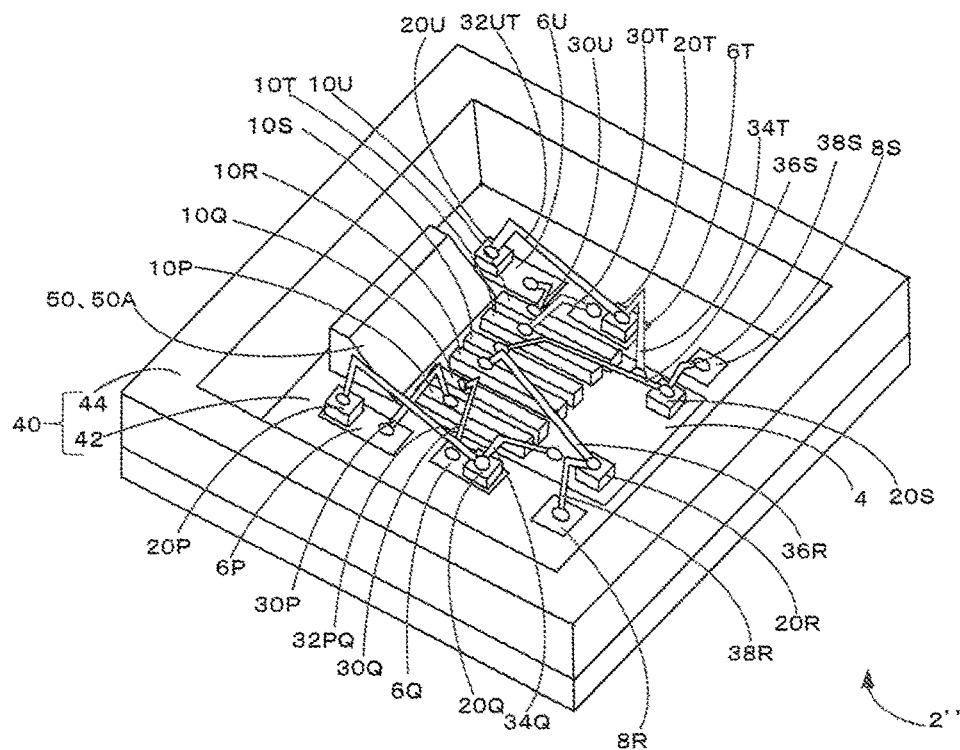
FIG. 6 is a perspective view schematically showing a light source device according a third embodiment of the present invention.
Figure 7:
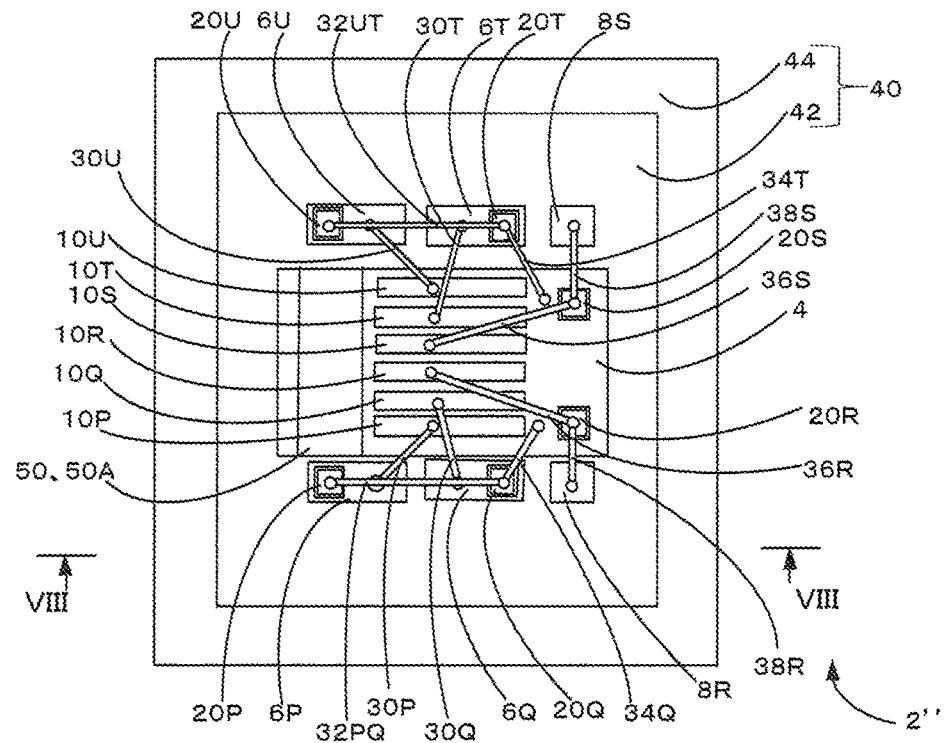
FIG. 7 is a plan view schematically showing a light source device according the third embodiment of the present invention.
Figure 8:
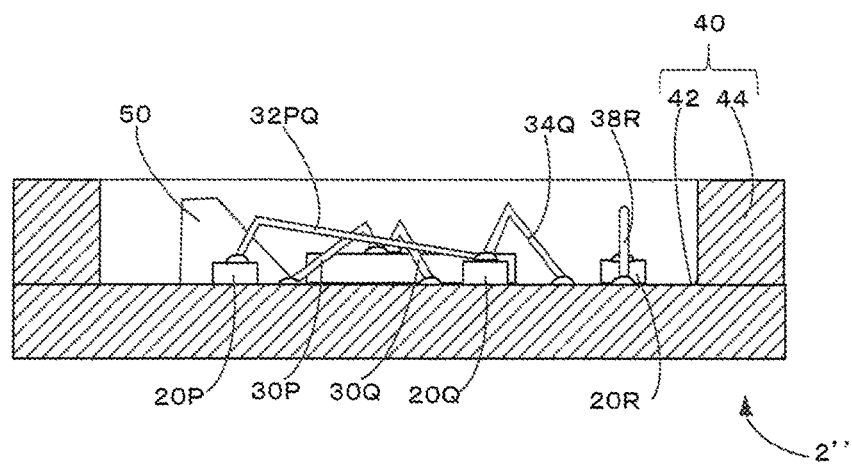
FIG. 8 is a sectional view taken along line VIII-VIII in FIG. 7.
Figure 9:
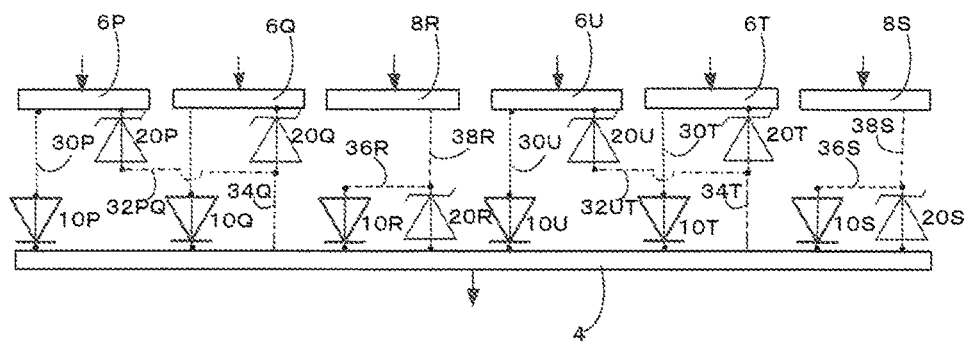
FIG. 9 is a circuit diagram showing a circuit configuration of a light source device according the third embodiment of the present invention.

Next, with reference to FIG. 6 to FIG. 9, the configuration of the light source device according to a second embodiment of the present disclosure will be described. FIG. 6 is a perspective view schematically showing a light source device according a third embodiment of the present invention. FIG. 7 is a plan view schematically showing a light source device according the third embodiment of the present invention. FIG. 8 is a sectional view taken along line VIII-VIII in FIG. 7. FIG. 9 is a circuit diagram showing a circuit configuration of a light source device according the third embodiment of the present invention. In the circuit diagram shown in FIG. 9, the flow of electric current (from upper side to lower side in the figure) is shown by arrows.

The light source device 2" according to the third embodiment includes the package 40 and the upward-reflecting mirror 50 having structures similar to those in the light source device 2 according to the first embodiment. In the third embodiment, six light emitting elements 10P to 10U can also be discretely controlled, and as shown in FIG. 6 and FIG. 7, three light emitting elements 10P to 10R and respectively corresponding protective elements 20P to 20R, and three light emitting elements 10S to 10U and respectively corresponding protective elements 20S to 20U are arranged substantially symmetrical and the wires are connected.

Light Emitting Elements 10P to 10R

In the description below, the three light emitting elements 10P to 10R and respectively corresponding protective elements 20P to 20R that are arranged in a lower side in FIG. 7 will be illustrated as the substantially symmetrically arranged components and corresponding wiring.

The configuration of the two light emitting elements 10P and 10Q and their corresponding protective elements 20P and 20Q are similar to those in the first embodiment. The lower-surface-side electrodes of the light emitting elements 10P and 10Q are connected to the first wiring 4, and the lower-surface-side electrodes of the protective elements 20P and 20Q are respectively connected to the second wiring 6P and 6Q corresponding to the light emitting elements 10P and 10Q. The upper-surface-side electrodes of the light emitting elements 10P and 10Q and the upper-surface-side electrodes of the protective elements 20P and 20Q have the same polarity (P-electrodes).

The first wire 30P connecting the upper-surface-side electrode of the light emitting element 10P and the second wiring 6P crosses below the second wire 32PQ connecting the upper-surface-side electrode of the protective element 20P and upper-surface-side electrode of the protective element 20Q. Similarly, the first wire 30Q connecting the upper-surface-side electrode of the light emitting element 10Q and the second wiring 6Q crosses below the second wire 32PQ connecting the upper-surface-side electrode of the protective element 20P and upper-surface-side electrode of the protective element 20Q. The upper-surface-side electrode of the protective element 20Q and the first wiring 4 are connected with the third wires 34Q.

Accordingly, the light emitting element 10P and the light emitting element 10Q can be discretely caused to emit light. Further, if a surge current or static electricity occurs on the second wiring 6P, electric current flows from the second wiring 6P to the lower-surface-side electrode (N-electrode) of the protective element 20P, and through the protective element 20P, flows to the upper-surface-side electrode (P-electrode) of the protective element 20P. Then, the electric current flows from the upper-surface-side electrode (P-electrode) of the protective element 20P through the second wire 32PQ to the upper-surface-side electrode (P-electrode) of the protective element 20Q, then from the upper-surface-side electrode (P-electrode) of the protective element 20Q, flows through the third wire 34Q to the first wiring 4.

With this arrangement, if a surge current or static electricity occurs on the second wiring 6Q, electric current flows from the second wiring 6Q to the lower-surface-side electrode (N-electrode) of the protective element 20Q, and through the protective element 20Q, flows to the upper-surface-side electrode (P-electrode) of the protective element 20Q. Then, the electric current flows from the upper-surface-side electrode (P-electrode) of the protective element 20Q through the third wire 34Q to the first wiring 4. With this arrangement, the light emitting elements 10P and 10Q can be reliably protected against reverse current.

The lower-surface-side electrode of the light emitting element 10R is connected to the first wiring 4, and the upper-surface-side electrode of the light emitting element 10R is a P-electrode as that of the light emitting elements 10P and 10Q. Meanwhile, the protective element 20R corresponding to the light emitting element 10R differs from that in the first embodiment. The upper-surface-side electrode of the protective element 20R is an N-electrode having a reverse polarity, and the protective element 20R is mounted on the first wiring 4 with the lower-surface-side electrode connected to the first wiring 4.

The upper-surface-side electrode of the light emitting element 10R and the upper-surface-side electrode of the protective element 20R are connected with a fourth wire 36R, and the upper-surface-side electrode of the protective element 20R and a discrete wiring 8R corresponding to the light emitting element 10R are connected with a fifth wire 38R.

When electric power is applied to the discrete wiring 8R, electric current flows through the fifth wire 38R to the upper-surface-side electrode of the protective element 20R, then from the upper-surface-side electrode of the protective element 20R, through the fourth wire 36R, flows to the upper-surface-side electrode (P-electrode) of the light emitting element 10R. Further, from the upper-surface-side electrode (P-electrode) of the light emitting element 10R, the electric current flows to the P-type cladding layer, the active layer, and the N-type cladding layer in this order, and from the lower-surface-side electrode of the light emitting element 10R flows to the first wiring 4. Accordingly, the light emitting element 10R can be discretely caused to emit light.

With this arrangement, if a surge current or static electricity occurs on the discrete wiring 8R, electric current flows from the discrete wire 8R, through the fifth wire 38R, to the upper-surface-side electrode (N-electrode) of the protective element 20R, and through the protective element 20P, flows to the lower-surface-side electrode (P-electrode) to the first wiring 4. With this arrangement, the electric current can be released to the first wiring 4 without a reverse current flows in the light emitting element 10R.

As described above, in the third embodiment, the light emitting element 10R mounted on the first wiring 4 and the protective element 20R of a reverse polarity are provided in addition to the light emitting elements 10P and 10Q mounted on the first wiring 4 and the present embodiments 20P and 20Q respectively mounted on the second wirings 6P and 6Q, thus realizing the light source device 2" of a small size in which, although having light emitting elements of various emission wavelength ranges, short circuit among wires is effectively avoided.

Light Emitting Elements 10S to 10U

Next, referring to FIG. 6 and FIG. 7, the light emitting elements 10S to 10U and respectively corresponding protective elements 20S to 20U, which are arranged symmetric with respect to the light emitting elements 10P to 10R and respectively corresponding protective elements 20P to 20R will be described. The arrangement of the light emitting elements 10P to 10R and respectively corresponding protective elements 20P to 20R and corresponding wirings and function are similar to those described above.

More specifically, the light emitting element 10U, the protective element 20U, the second wiring 6U, and the first wire 30U respectively corresponds to the light emitting element 10P, the protective element 20P, the second wiring 6P, and the first wire 30P. Similarly, the light emitting element 10T, the protective element 20T, the second wiring 6T, and the first wire 30T respectively corresponds to the light emitting element 10Q, the protective element 20Q, the second wiring 6Q, and the first wire 30Q.

Similarly, the light emitting element 10S, the protective element 20S, the discrete wiring 8S, the fourth wire 36S, and the fifth wire 38S respectively corresponds to the light emitting element 10R, the protective element 20R, the discrete wiring 8R, the fourth wire 36R, and the fifth wire 38R. Further, the second wire 32UT corresponds to the second wire 32PQ described above, and the third wire 34T corresponds to the third wire 34Q described above. The configuration of those are similar to that described above and accordingly, repetitive description will be omitted.

As described above, the light source devices 2, 2', and 2" according to the embodiments include, at least one first wiring 4; a plurality of second wirings 6; a plurality of light emitting elements 10 each having a lower-surface-side electrode connected to a respective one of the at least one first wiring 4; a plurality of protective elements 20 each having a lower-surface-side electrode connected to a respective one of the plurality of second wirings 6 each corresponding to a respective one of the plurality of light emitting elements 10, each of the plurality of protective elements 20 connected to a respective one of the plurality of light emitting elements 10; a plurality of first wirings 4 each connecting an upper-surface-side electrode of each of the plurality of light emitting elements 10 and a respective one of the plurality of second wirings 6; a plurality of second wires 32 each connecting the upper-surface-side electrodes of two adjacent ones of the protective elements 20; and a plurality of third wires 34 each connecting an upper-surface-side electrode of a respective one of the plurality of protective elements 20 and a corresponding one of the at least one first wiring 4. The upper-surface-side electrodes of the plurality of light emitting elements 10 and the upper-surface-side electrodes of the plurality of protective elements 20 are of a same polarity, and the plurality of first wires 30 are disposed below the plurality of second wires 32.

With the arrangement described above, in the light source devices 2, 2', and 2" respectively configured to discretely control a plurality of light emitting elements 10, short circuit of wires 30, 32, 34 can be efficiently prevented by spatially arranging the wires by using the height of the protective elements 20, even when the light emitting elements 10 mounted on the first wiring 4 and the protective elements 20 respectively mounted on the second wirings 6 are closely arranged, and accordingly, can provide the light source devices 2, 2', and 2" of a small size in which a plurality of light emitting elements 10 can be discretely controlled.

While the present invention has been described according to the embodiments and the aspects with certain degrees of details, contents of disclosure of the embodiments and aspects shall be varied in details of the configuration, and the combination of elements and the change of order in the embodiments and aspects can be realized without deviating from the scope of the claims and contents of the present invention.

What is claimed is:
1. A light source device comprising:
at least one first wiring;
a plurality of second wirings;
a plurality of light emitting elements each having a lower-surface-side electrode connected to a respective one of the at least one first wiring;
a plurality of protective elements each having a lower-surface-side electrode connected to a respective one of the plurality of second wirings each corresponding to a respective one of the plurality of light emitting elements, each of the plurality of protective elements connected to a respective one of the plurality of light emitting elements;

a plurality of first wires each connecting an upper-surface-side electrode of each of the plurality of light emitting elements and a respective one of the plurality of second wirings;
a plurality of second wires each connecting the upper-surface-side electrodes of two adjacent ones of the protective elements; and
a plurality of third wires each connecting an upper-surface-side electrode of a respective one of the plurality of protective elements and a corresponding one of the at least one first wiring;
wherein the upper-surface-side electrodes of the plurality of light emitting elements and the upper-surface-side electrodes of the plurality of protective elements are of a same polarity; and
the plurality of first wires are disposed below the plurality of second wires.

2. The light source device according to claim 1, wherein the at least one first wiring and the plurality of second wirings are disposed on substantially a same plane.

3. The light source device according to claim 1, wherein the upper-surface-side electrodes of the plurality of protective elements corresponding to the plurality of light emitting elements having a same emission wavelength range are connected through the second wires.

4. The light source device according to claim 1, wherein the upper-surface-side electrodes of the plurality of protective elements corresponding to the plurality of light emitting elements with different semiconductor materials are connected through the second wires.

5. The light source device according to claim 1 comprising:
a further plurality of light emitting elements each having a lower-surface-side electrode connected to a respective one of the at least one first wiring;
a further plurality of protective elements each having a lower-surface-side electrode connected to a respective one of the plurality of second wirings each corresponding to a respective one of the plurality of light emitting elements, each of the plurality of protective elements connected to a respective one of the plurality of light emitting elements;
and further, a plurality of discrete wirings each corresponding to a respective one of the further plurality of light emitting elements;
wherein the upper-surface-side electrodes of the further plurality of light emitting elements and the upper-surface-side electrodes of the further plurality of protective elements have different polarities, and the upper-surface-side electrode of each of the further plurality of light emitting elements, the upper-surface-side electrode of each of the further plurality of protective elements respectively corresponding to each of the further plurality of light emitting elements, and corresponding one of the plurality of discrete wirings are connected by wires.

6. The light source device according to claim 1, wherein the light emitting elements include a light emitting element that emits light in a blue wavelength range, a light emitting element that emits light in a green wavelength range, and a light emitting element that emits light in a red wavelength range.

7. The light source device according to claim 6, wherein the light emitting element that emits light in a green wavelength range is a nitride semiconductor laser element and the light emitting element that emits light in a red wavelength range is a GaAs-based semiconductor laser element.

8. The light source device according to claim 1, wherein at least one of the light emitting elements has a plurality of electrodes.

9. The light source device according to claim 1, wherein the light emitting elements are laser diodes.

10. The light source device according to claim 1, wherein an upward-reflecting mirror is disposed at a light-emitting side of the plurality of light emitting elements, and at least some of the protective elements are disposed at a lateral side with respect to the upward-reflecting mirror.

11. The light source device according to claim 1, wherein step portions each having an upper surface located higher than the upper surface of the substrate are provided at both lateral sides in the width direction, and the second wirings are disposed on the upper surfaces of the step portions.

12. The light source device according to claim 1, wherein in addition to the protective element mounted on the second wiring, a further protective element having a lower-surface-side electrode connected to the first wiring is provided, and an upper-surface-side electrode of the further protective element and the upper-surface-side electrode of the light emitting element are connected with a fourth wire.

* * * * *